(12) United States Patent
Kuwano et al.

(10) Patent No.: US 12,426,288 B2
(45) Date of Patent: Sep. 23, 2025

(54) SEMICONDUCTOR DEVICE AND METHOD FOR MANUFACTURE THEREOF

(71) Applicant: DENSO CORPORATION, Kariya (JP)

(72) Inventors: Satoshi Kuwano, Toyota (JP); Tsuyoshi Nishiwaki, Toyota (JP); Yuta Furumura, Toyota (JP)

(73) Assignee: DENSO CORPORATION, Kariya (JP)

( * ) Notice: Subject to any disclaimer, the term of this patent is extended or adjusted under 35 U.S.C. 154(b) by 509 days.

(21) Appl. No.: 17/583,426

(22) Filed: Jan. 25, 2022

(65) Prior Publication Data

US 2022/0149190 A1 May 12, 2022

Related U.S. Application Data

(63) Continuation of application No. PCT/JP2019/033386, filed on Aug. 26, 2019.

(51) Int. Cl.
| | |
|---|---|
| *H10D 12/00* | (2025.01) |
| *H10D 8/00* | (2025.01) |
| *H10D 12/01* | (2025.01) |
| *H10D 62/17* | (2025.01) |
| *H10D 84/60* | (2025.01) |

(52) U.S. Cl.
CPC ........... *H10D 12/481* (2025.01); *H10D 8/422* (2025.01); *H10D 12/038* (2025.01); *H10D 62/393* (2025.01); *H10D 84/617* (2025.01)

(58) Field of Classification Search
CPC ............. H01L 29/7397; H01L 29/1095; H01L 29/66348; H01L 29/8613; H01L 29/4236; H01L 29/7813; H01L 29/66734; H01L 27/0664; H10D 12/481; H10D 12/038; H10D 84/617; H10D 8/422; H10D 62/393

See application file for complete search history.

(56) References Cited

U.S. PATENT DOCUMENTS

| | | | |
|---|---|---|---|
| 5,508,534 A * | 4/1996 | Nakamura | H01L 29/7813 257/E29.115 |
| 5,578,522 A | 11/1996 | Nakamura et al. | |
| 9,455,136 B2 * | 9/2016 | Steinbrenner | H01L 21/02271 |
| 2014/0048847 A1 * | 2/2014 | Yamashita | H01L 29/7806 257/140 |
| 2015/0372094 A1 | 12/2015 | Horii et al. | |

(Continued)

FOREIGN PATENT DOCUMENTS

| | | |
|---|---|---|
| JP | S63-111668 A | 5/1988 |
| JP | 2003-258255 A | 9/2003 |

(Continued)

*Primary Examiner* — Jessica S Manno
*Assistant Examiner* — Andrew Chung
(74) *Attorney, Agent, or Firm* — Posz Law Group, PLC

(57) ABSTRACT

A semiconductor device includes: a semiconductor substrate; a trench gate portion on the semiconductor substrate; a surface electrode covering an upper side of the semiconductor substrate; and an interlayer insulating film insulating the trench gate portion from the surface electrode. The semiconductor substrate includes: a drift region; a body region above the drift region; a barrier region below at least a part of the body region; and a pillar region extending from the surface of the semiconductor substrate to the barrier region and in Schottky contact with the surface electrode. The interlayer insulating film has an acute angle between a top surface and a side surface thereof.

6 Claims, 14 Drawing Sheets

(56) References Cited

U.S. PATENT DOCUMENTS

| | | |
|---|---|---|
| 2017/0018547 A1 | 1/2017 | Naito |
| 2018/0286974 A1* | 10/2018 | Kumazawa ....... H01L 29/41741 |
| 2019/0013313 A1 | 1/2019 | Naito |
| 2019/0097030 A1* | 3/2019 | Miyata .............. H01L 29/42368 |
| 2021/0111250 A1* | 4/2021 | Wakimoto ............ H01L 29/401 |

FOREIGN PATENT DOCUMENTS

| | | |
|---|---|---|
| JP | 2016-201498 A | 12/2016 |
| JP | 2018-022836 A | 2/2018 |
| JP | 2018-125443 A | 8/2018 |

* cited by examiner

SEMICONDUCTOR DEVICE AND METHOD FOR MANUFACTURE THEREOF

CROSS REFERENCE TO RELATED APPLICATION

The present application is a continuation application of International Patent Application No. PCT/JP2019/033386 filed on Aug. 26, 2019, which designated the U.S. The entire disclosures of all of the above applications are incorporated herein by reference.

TECHNICAL FIELD

The present disclosure relates to a semiconductor device and a manufacturing method of a semiconductor device.

BACKGROUND

A type of semiconductor device called a reverse conducting Insulated Gate Bipolar Transistor (reverse conducting IGBT) has been developed. The semiconductor substrate of this type of semiconductor device has an IGBT range provided with an IGBT structure and a diode range provided with a diode structure. The diode structure is connected in antiparallel to the IGBT structure and can operate as a freewheeling diode.

SUMMARY

According to an example, a semiconductor device includes: a semiconductor substrate; a trench gate portion on the semiconductor substrate; a surface electrode covering an upper side of the semiconductor substrate; and an interlayer insulating film insulating the trench gate portion from the surface electrode. The semiconductor substrate includes: a drift region; a body region above the drift region; a barrier region below at least a part of the body region; and a pillar region extending from the surface of the semiconductor substrate to the barrier region and in Schottky contact with the surface electrode. The interlayer insulating film has an acute angle between a top surface and a side surface thereof.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
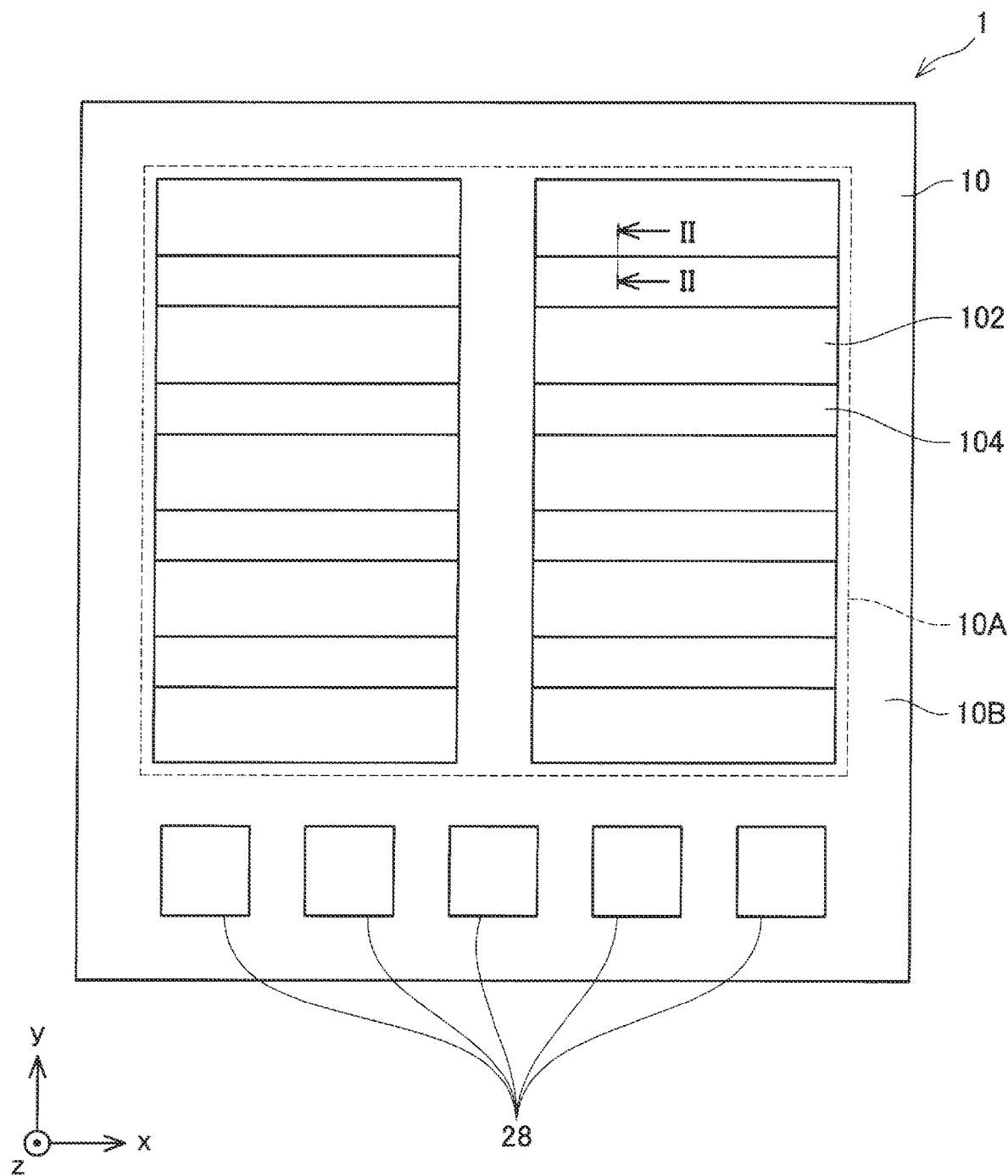
FIG. 1 schematically shows a plan view of the semiconductor device of the present embodiment.

A conceivable technique teaches a technique for forming an n-type barrier region disposed below a p-type body region in this type of semiconductor device. The barrier region is electrically connected to the emitter electrode via a pillar region extending from the surface of the semiconductor substrate. The pillar region is configured to make Schottky contact with the surface electrode in order to suppress leakage current. Since the barrier region is electrically connected to the emitter electrode via the pillar region, the potential of the barrier region is maintained at a potential close to the potential of the emitter electrode. As a result, the voltage applied in the forward direction of the pn junction formed by the body region and the barrier region is suppressed to a low value, the amount of holes injected from the body region into the drift region is reduced, and the reverse recovery characteristic is improved.

As a material for the emitter electrode of this type of semiconductor device, an alloy including silicon (for example, aluminum silicon (AlSi)) is used in order to realize good electrical characteristics. Therefore, there is a difficulty that silicon included in the emitter electrode is deposited on the surface of the semiconductor substrate to form silicon nodules. In particular, when such silicon nodules are deposited at the formation position of the pillar region, the barrier height between the pillar region and the surface electrode changes, so that a difficulty may be generated such that the leakage current increases.

The present embodiments provides a technique for controlling the deposition position of silicon nodules and suppressing the deposition of silicon nodules at the formation position of the pillar region.

The semiconductor device according to the present embodiments includes a semiconductor substrate, a trench gate portion provided on one main surface of the semiconductor substrate, a surface electrode covering the upper part of the one main surface of the semiconductor substrate, and an interlayer insulating film that insulates the trench gate portion from the surface electrode. The semiconductor substrate has a first conductive type drift region, a second conductive type body region provided above the drift region, and a first conductive type barrier region provided below at least a part of the body region and a first conductive pillar region that extends from one of the main surfaces of the semiconductor substrate to the barrier region and makes Schottky contact with the surface electrode. The surface electrode is an alloy including silicon. The interlayer insulating film has an acute angle formed by the top surface and the side surface thereof.

According to the configuration of the semiconductor device, it is possible to control the silicon nodules to be selectively deposited at a position corresponding to the lower end of the side surface of the interlayer insulating film on the one main surface of the semiconductor substrate. As a result, it is possible to prevent silicon nodules from depositing at the formation position of the pillar region.

The method for manufacturing a semiconductor device according to the present embodiments is applicable to a method for manufacturing a semiconductor device which includes a semiconductor substrate, a trench gate portion provided on one main surface of the semiconductor substrate, a surface electrode covering an upper portion of the one main surface of the semiconductor substrate, and an interlayer insulating film that insulates the trench gate portion from the surface electrode. The semiconductor substrate includes a first conductive type drift region, a second conductive type body region disposed above the drift region, a first conductive type barrier region provided below at least a part of the body region, and a first conductive type pillar region that extends from the one main surface of the semiconductor substrate to the barrier region and makes a Schottky contact with the surface electrode. The surface electrode is an alloy including silicon. This manufacturing method includes: steps of: forming the interlayer insulating film on the one main surface of the semiconductor substrate on which the trench gate portion is formed; patterning a mask on a part of the interlayer insulating film corresponding to the position where the trench gate portion is formed; and etching a part of the interlayer insulating film using an isotropic etching technique, whereby the angle formed by the top surface and the side surface of the interlayer insulating film is controlled to be a sharp angle.

According to the manufacturing method of the semiconductor device, it is possible to control the silicon nodules to be selectively deposited at a position corresponding to the lower end of the side surface of the interlayer insulating film on the one main surface of the semiconductor substrate. As a result, it is possible to prevent silicon nodules from depositing at the formation position of the pillar region.

Hereinafter, the semiconductor device according to the present embodiment will be described with reference to the drawings. In each drawing, in the common components, for the purpose of clarifying the illustration, only one component is defined by a reference numeral and the other components are omitted.

FIG. 1 schematically shows a plan view of the semiconductor device 1 according to the present embodiment. The semiconductor device 1 is a type of semiconductor device called a reverse conduction IGBT, and is manufactured by using the semiconductor substrate 10. The semiconductor substrate 10 has an element region 10A and a peripheral region 10B located around the element region 10A. The element region 10A of the semiconductor substrate 10 is divided into an IGBT range 102 provided with an IGBT structure and a diode range 104 provided with a diode structure. The IGBT range 102 and the diode range 104 are, for example, repeatedly arranged alternately along the y direction in the element region 10A when viewed from a direction orthogonal to the surface of the semiconductor substrate 10 (hereinafter, referred to as "in a plan view"). A peripheral withstand structure such as a guard ring is formed in the semiconductor substrate 10 corresponding to the peripheral region 10B. Further, a plurality of small signal pads 28 are provided on the semiconductor substrate 10 corresponding to the peripheral region 10B. Examples of the type of the small signal pad 28 include a gate pad for inputting a gate signal, a temperature sense pad for outputting a temperature sense signal, and a current sense pad for outputting a current sense signal.

Figure 2:
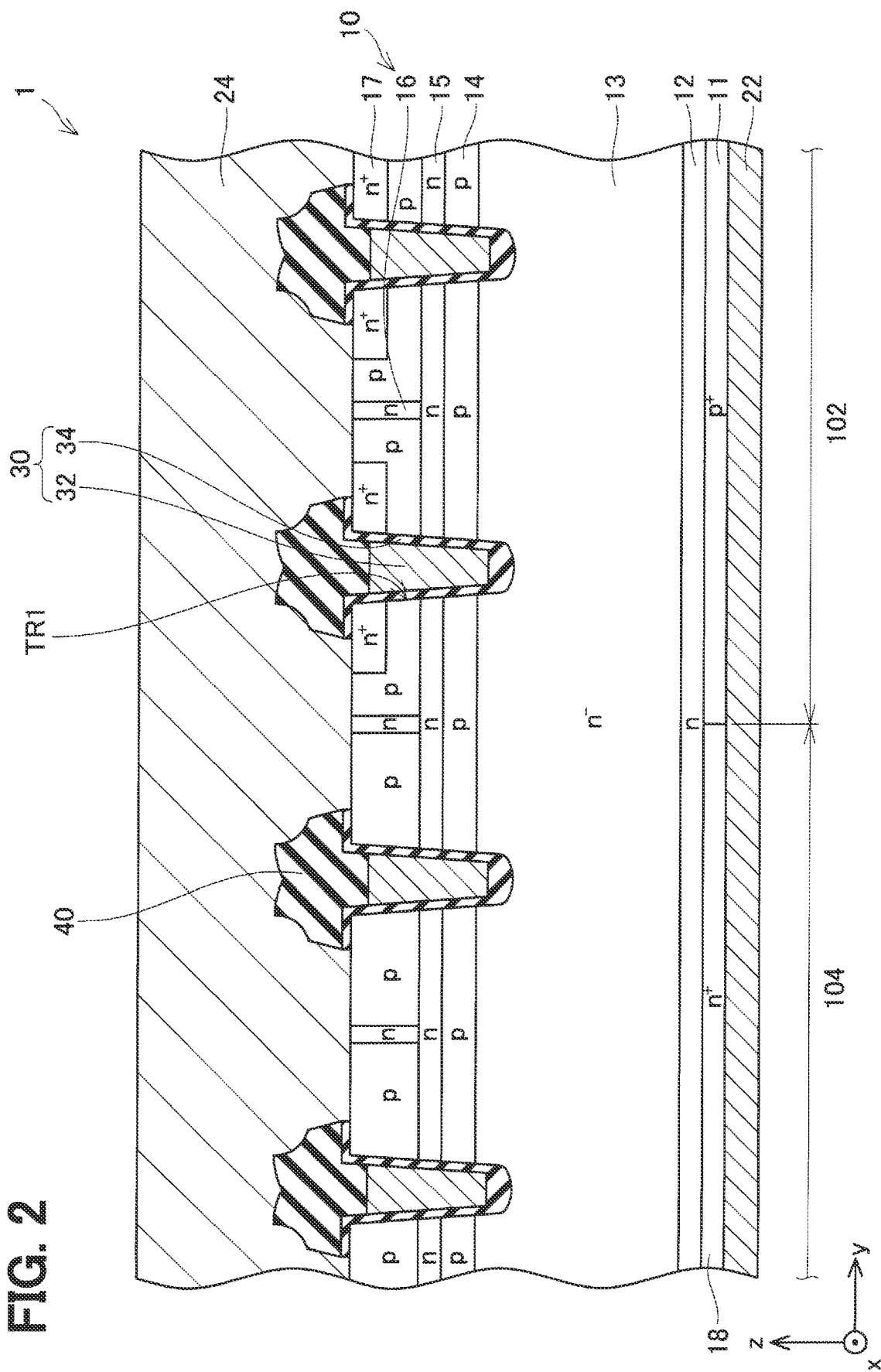
FIG. 2 schematically shows a cross-sectional view of a main part of a boundary between an IGBT range and a diode range partitioned in an element region of the semiconductor device of the present embodiment, and is a partial cross-sectional view of a position corresponding to line II-II of FIG. 1.

FIG. 2 schematically shows a cross-sectional view of a main part corresponding to lines II-II of FIG. 1. FIG. 2 corresponds to the boundary between the IGBT range 102 and the diode range 104. As shown in FIG. 2, the semiconductor device 1 is provided with a semiconductor substrate 10 which is a silicon substrate, the collector electrode 22 which is provided so as to cover the back surface of the semiconductor substrate 10, an emitter electrode 24 which is provided so as to cover the surface of the semiconductor substrate 10, a trench gate portion 30 provided on the surface of the semiconductor substrate 10, and an interlayer insulating film 40 that insulates the trench gate portion 30 from the emitter electrode 24. The emitter electrode 24 is made of aluminum silicon (AlSi), which is an alloy including aluminum and silicon.

The semiconductor substrate 10 includes a p+ type collector region 11, an n type buffer region 12, an n− type drift region 13, a p type body region 14, an n type barrier region 15, an n type pillar region 16, n+ type emitter region 17 and an n+ type cathode region 18.

The collector region 11 is arranged in a part of the back layer portion of the semiconductor substrate 10 and is provided at a position exposed on the back surface of the semiconductor substrate 10. The collector region 11 is in ohmic contact with the collector electrode 22 that covers the back surface of the semiconductor substrate 10. The collector region 11 is formed in the back layer portion of the semiconductor substrate 10 by ion-implanting boron toward the back surface of the semiconductor substrate 10 by using the ion implantation technique.

The cathode region 18 is arranged in a part of the back layer portion of the semiconductor substrate 10 and is provided at a position exposed on the back surface of the semiconductor substrate 10. The cathode region 18 is in ohmic contact with the collector electrode 22 that covers the back surface of the semiconductor substrate 10. The cathode region 18 is formed in the back layer portion of the semiconductor substrate 10 by ion-implanting phosphorus toward the back surface of the semiconductor substrate 10 by using the ion implantation technique.

In this way, the collector region 11 and the cathode region 18 are arranged adjacent to each other in the back layer portion of the semiconductor substrate 10. In the semiconductor substrate 10, the range in which the collector region 11 is formed is partitioned as the IGBT range 102, and the range in which the cathode region 18 is formed is partitioned as the diode range 104, depending on the presence or absence of the emitter region 17 on the surface layer of the semiconductor substrate 10.

The buffer region 12 is provided on the surfaces of the collector region 11 and the cathode region 18, is arranged between the collector region 11 and the drift region 13, and is further arranged between the cathode region 18 and the drift region 13. The buffer region 12 is a region in which the concentration of n type impurities is higher than that of the drift region 13. The buffer region 12 is formed by ion-implanting phosphorus toward the back surface of the semiconductor substrate 10 using ion implantation technology.

The drift region 13 is provided on the surface of the buffer region 12 and is arranged between the buffer region 12 and the body region 14. The drift region 13 is a remaining portion in which another semiconductor region is formed in the semiconductor substrate 10.

The body region 14 is provided on the surface of the drift region 13, is arranged in the surface layer portion of the semiconductor substrate 10, and is arranged at a position exposed on the surface of the semiconductor substrate 10. The body region 14 is in ohmic contact with the emitter electrode 24 that covers the surface of the semiconductor substrate 10. The body region 14 may have a contact region having a high concentration of p type impurities in order to improve the ohmic property with the emitter electrode 24. The body region 14 is formed in the surface layer portion of the semiconductor substrate 10 by ion-implanting boron toward the front surface of the semiconductor substrate 10 by using the ion implantation technique.

The barrier region 15 is provided in the body region 14 and extends so as to extend in the surface direction of the semiconductor substrate 10 and so as to be in contact with both side surfaces of the adjacent trench gate portions 30. The barrier region 15 is arranged so as to separate the body region 14 in the thickness direction of the semiconductor substrate 10. The barrier region 15 may be arranged below the entire body region 14, that is, between the drift region 13 and the body region 14. Further, the barrier region 15 may be selectively formed only in the diode range 104, and may not be formed in the IGBT range 102. The barrier region 15 is formed in the surface layer portion of the semiconductor substrate 10 by ion-implanting phosphorus toward the surface of the semiconductor substrate 10.

The pillar region 16 is provided in the body region 14, and extends from the surface of the semiconductor substrate 10 to the barrier region 15 through a part of the body region 14. The pillar region 16 is located between adjacent trench gate portions 30 and at a position spaced away from the side surface of the trench gate portion 30. The pillar region 16 is in Schottky contact with the emitter electrode 24 covering the surface of the semiconductor substrate 10. As a result, the barrier region 15 is electrically connected to the emitter electrode 24 via the pillar region 16. When the barrier region 15 is selectively formed only in the diode range 104, the pillar region 16 may be selectively formed only in the diode range 104 and may not be formed in the IGBT range 102. The pillar region 16 is formed in the surface layer portion of the semiconductor substrate 10 by ion-implanting phosphorus toward the surface of the semiconductor substrate 10.

The emitter region 17 is provided on the surface of the body region 14, is arranged in the surface layer portion of the semiconductor substrate 10, and is arranged at a position exposed on the surface of the semiconductor substrate 10. The emitter region 17 is in contact with the side surface of the trench gate portion 30 and is in ohmic contact with the emitter electrode 24. The emitter region 17 is selectively formed in the IGBT range 102 of the semiconductor substrate 10, and is not formed in the diode range 104 of the semiconductor substrate 10. The emitter region 17 is formed in the surface layer portion of the semiconductor substrate 10 by ion-implanting phosphorus toward the front surface of the semiconductor substrate 10 by using the ion implantation technique.

The trench gate portion 30 is provided in the trench TR1 formed on the surface of the semiconductor substrate 10, and has a gate electrode 32 and a gate insulating film 34. The gate electrode 32 is insulated from the semiconductor substrate 10 by the gate insulating film 34, and is insulated from the emitter electrode 24 by the interlayer insulating film 40. The trench gate portion 30 penetrates the body region 14 from the surface of the semiconductor substrate 10 and reaches the drift region 13. In this example, the trench gate portion 30 extends along the x direction in the element region 10A of the semiconductor substrate 10. That is, the trench gate portion 30 has a structure in which the x direction is the longitudinal direction and the y direction is the lateral direction. Further, in this example, a plurality of trench gate portions 30 are arranged so as to be arranged along the y direction at predetermined intervals in the element region 10A of the semiconductor substrate 10. As described above, the plurality of trench gate portions 30 have a striped layout when viewed in a plan view. The layout of the plurality of trench gate portions 30 may not be particularly limited. Instead of this example, the plurality of trench gate portions 30 may have a grid-like layout when viewed in a plan view. The plurality of trench gate portions 30 are formed in both the IGBT range 102 and the diode range 104. The trench gate portion 30 arranged in the diode range 104 among the plurality of trench gate portions 30 may be used as a dummy gate. When used as a dummy gate, the gate electrode 32 may not be electrically connected to the gate wiring, and a voltage having a magnitude and/or a phase different from the gate voltage may be applicable. When used as a dummy gate, for example, the gate electrode 32 may be short-circuited to the emitter electrode 24.

Figure 3:
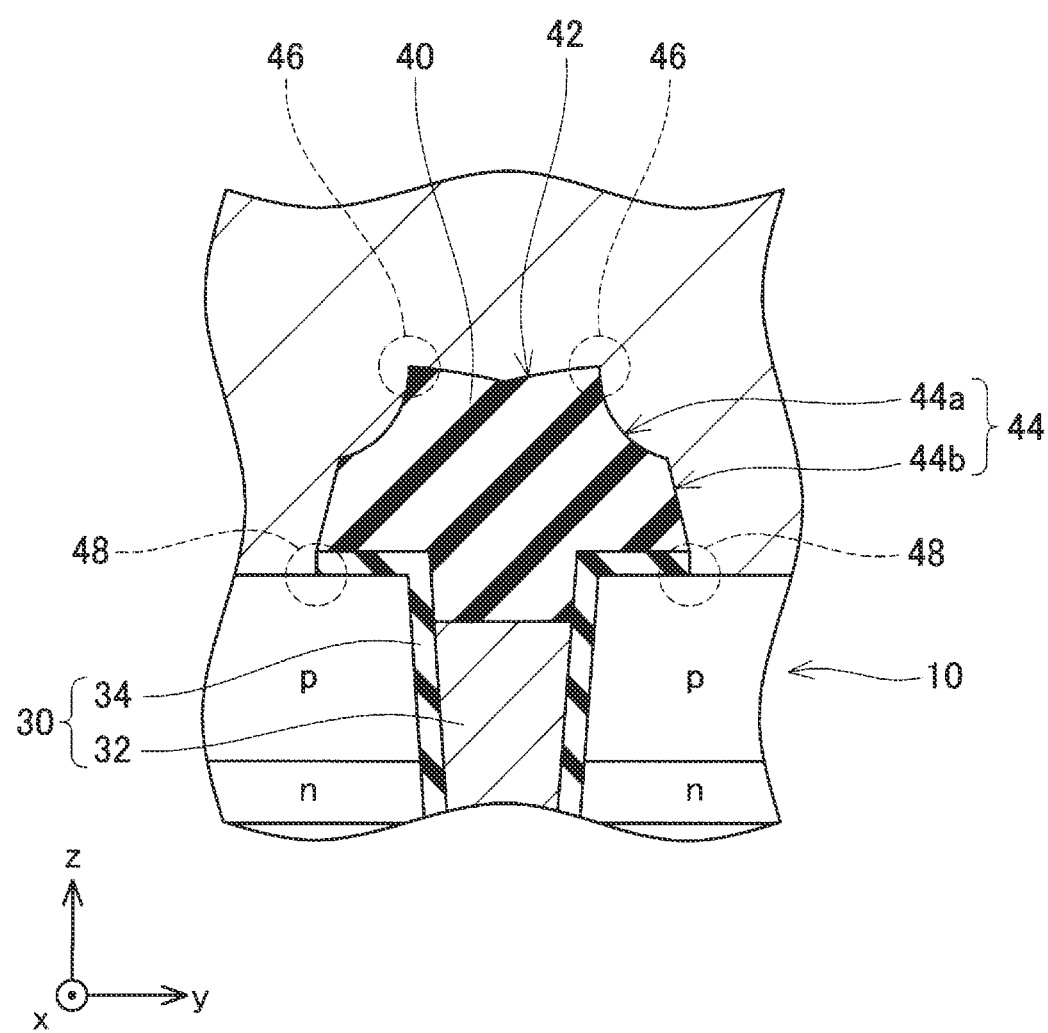
FIG. 3 schematically shows an enlarged cross-sectional view of a main part of an interlayer insulating film of the semiconductor device of the present embodiment.

FIG. 3 shows an enlarged cross-sectional view of the interlayer insulating film 40 provided on the surface of the trench gate portion 30. Note that FIG. 3 corresponds to an enlarged view of a cross section parallel to the yz plane. Further, in FIG. 3, the interlayer insulating film 40 provided in the diode range 104 is shown, and the interlayer insulating film 40 provided in the IGBT range 102 also has the same configuration.

The interlayer insulating film 40 is configured to be wider than the width in the lateral direction (y direction) of the trench gate portion 30 so as to completely cover the surface of the gate electrode 32. The interlayer insulating film 40 has a top surface 42 and a side surface 44. The top surface 42 extends substantially parallel to the surface of the semiconductor substrate 10. The side surface 44 has an upper side surface 44a and a lower side surface 44b. The upper side surface 44a defines the upper side of the side surface 44, is adjacent to the top surface 42, and is formed of a concave curved surface. The lower side surface 44b defines the lower side of the side surface 44, is adjacent to the surface of the semiconductor substrate 10 via the gate insulating film 34, and is formed of a flat planar surface. Since the gate insulating film 34 is extremely thin, it can be said that the lower side surface 44b is substantially adjacent to the surface of the semiconductor substrate 10. As will be described later, the upper side surface 44a has a concave curved surface shape reflecting the processing by isotropic etching, and the lower side surface 44b has a flat planar surface shape reflecting the processing by anisotropic etching.

Since the upper side surface 44a is formed of a concave curved surface, the angle formed by the corner portion 46 between the top surface 42 and the upper side surface 44a is an acute angle. As will be described later, when the angle formed by the corner portion 46 is configured to be an acute angle, it becomes possible to control so that silicon nodules are selectively deposited at the position corresponding to the lower end of the side surface of the interlayer insulating film 40 on the surface of the semiconductor substrate 10 (enclosed by the broken line 48).

The semiconductor device 1 can control on and off of the current flowing in the IGBT range 102 from the collector electrode 22 toward the emitter electrode 24 based on the gate voltage applied to the gate electrode 32 of the trench gate portion 30. Further, in the semiconductor device 1, the diode structure formed in the diode range 104 can operate as a freewheel diode. In particular, in the semiconductor device 1, since the barrier region 15 and the pillar region 16 are provided, the reverse recovery characteristic in the diode operation is improved. This diode operation will be described below.

When a potential higher than that of the collector electrode 22 is applied to the emitter electrode 24, a reflux current flows in each of the IGBT range 102 and the diode range 104. Hereinafter, a case where the potential of the emitter electrode 24 is gradually increased from a potential equivalent to that of the collector electrode 22 will be described. When the potential of the emitter electrode 24 rises, the Schottky junction between the pillar region 16 and the emitter electrode 24 becomes conductive. As a result, electrons flow from the collector electrode 22 toward the emitter electrode 24. As described above, when the potential of the emitter electrode 24 is relatively low, the Schottky barrier diode conducts, and a current flows from the emitter electrode 24 toward the collector electrode 22.

When the Schottky barrier diode conducts, the potential of the barrier region 15 is maintained at a potential close to the potential of the emitter electrode 24, so that the voltage applied in the forward direction of the pn junction formed by the body region 14 and the barrier region 15 is suppressed to a low level. Therefore, when the potential of the emitter electrode 24 is relatively low, the pn diode does not conduct. When the potential of the emitter electrode 24 becomes relatively high, the current flowing through the Schottky barrier diode increases. As the current flowing through the Schottky barrier diode increases, the potential difference between the emitter electrode 24 and the barrier region 15 increases, and the voltage applied in the forward direction of the pn junction formed by the body region 14 and the barrier region 15 also increases. Thus, holes are injected from the body region 14 through the barrier region 15. As a result, holes flow from the emitter electrode 24 toward the collector electrode 22. On the other hand, electrons flow from the collector electrode 22 toward the emitter electrode 24. As described above, when the potential of the emitter electrode 24 is relatively high, the pn diode conducts.

As described above, when the potential of the emitter electrode 24 is increased, the Schottky barrier diode conducts first, so that the timing at which the pn diode conducts is delayed. As a result, the amount of holes injected from the body region 14 into the drift region 13 when the reflux current flows is suppressed. After that, when a potential higher than that of the emitter electrode 24 is applied to the collector electrode 22, the pn diode performs a reverse recovery operation. At this time, since the amount of holes injected from the body region 14 into the drift region 13 is suppressed, the reverse current when the pn diode executes a reverse-recover operation is also reduced. As described above, in the semiconductor device 1, the barrier region 15 and the pillar region 16 are provided, so that the reverse recovery characteristic in the diode operation is improved.

Figure 4:
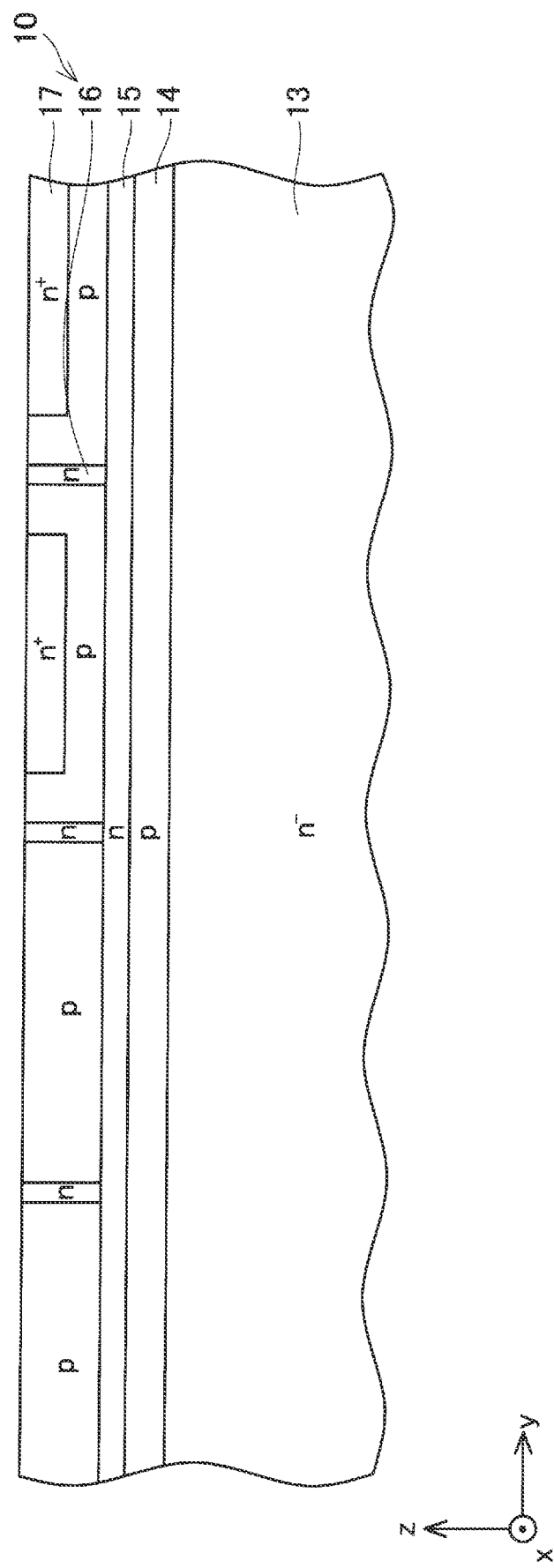
FIG. 4 schematically shows a cross-sectional view of a main part of the manufacturing process of the semiconductor device of the present embodiment, and is a partial cross-sectional view of the main part at a position corresponding to line II-II of FIG. 1.

Next, a method of manufacturing the semiconductor device 1 will be described with reference to the drawings. First, as shown in FIG. 4, a semiconductor substrate 10 in which various semiconductor regions are formed in the surface layer portion of the semiconductor substrate 10 is prepared. Here, at least a part of various semiconductor regions may be formed after carrying out the steps described later.

Figure 5:
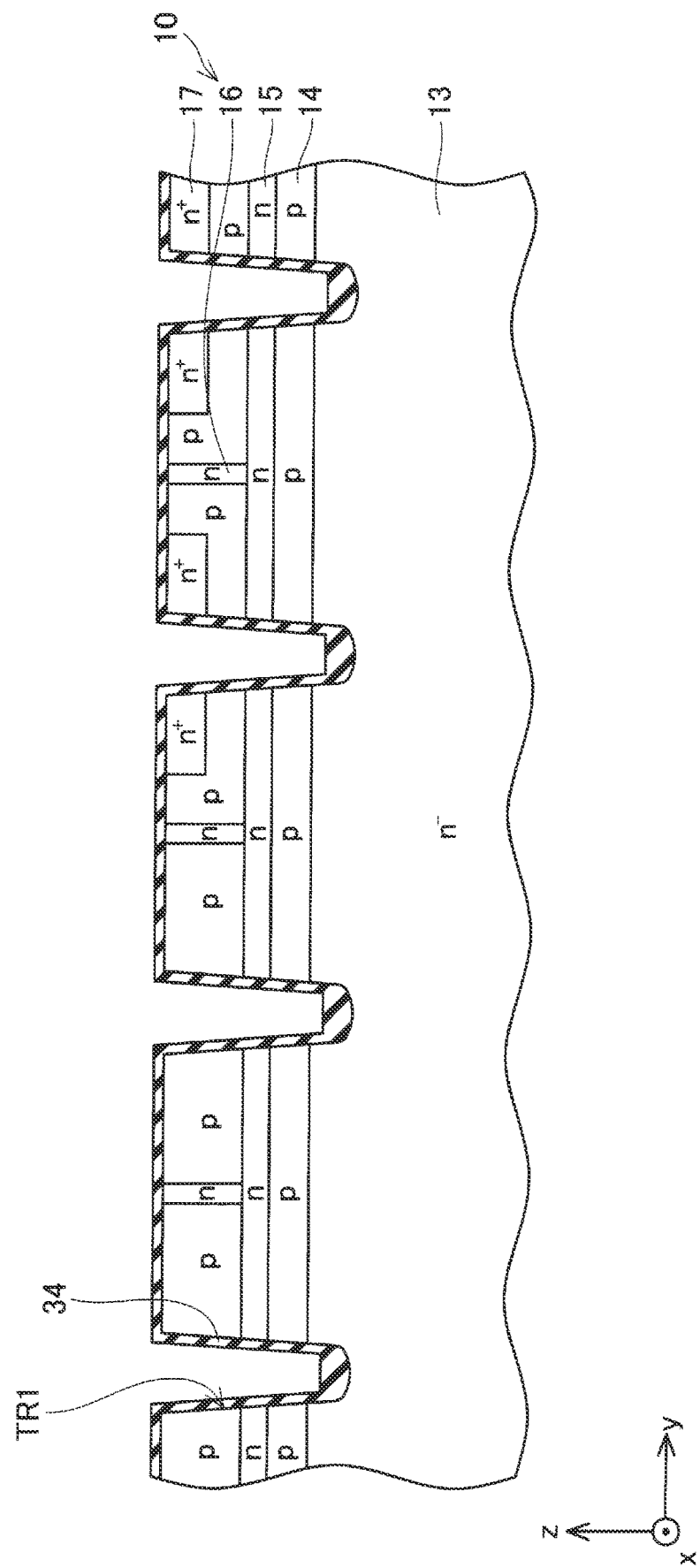
FIG. 5 schematically shows a cross-sectional view of a main part of the manufacturing process of the semiconductor device of the present embodiment, and is a partial cross-sectional view of the main part at a position corresponding to line II-II of FIG. 1.

Next, as shown in FIG. 5, an anisotropic dry etching technique is used to form a trench TR1 that penetrates the body region 14 from the surface of the semiconductor substrate 10 and reaches the drift region 13. Next, the gate insulating film 34 is formed on the inner surface of the trench TR1 and the surface of the semiconductor substrate 10 by using the thermal oxidation technique.

Figure 6:
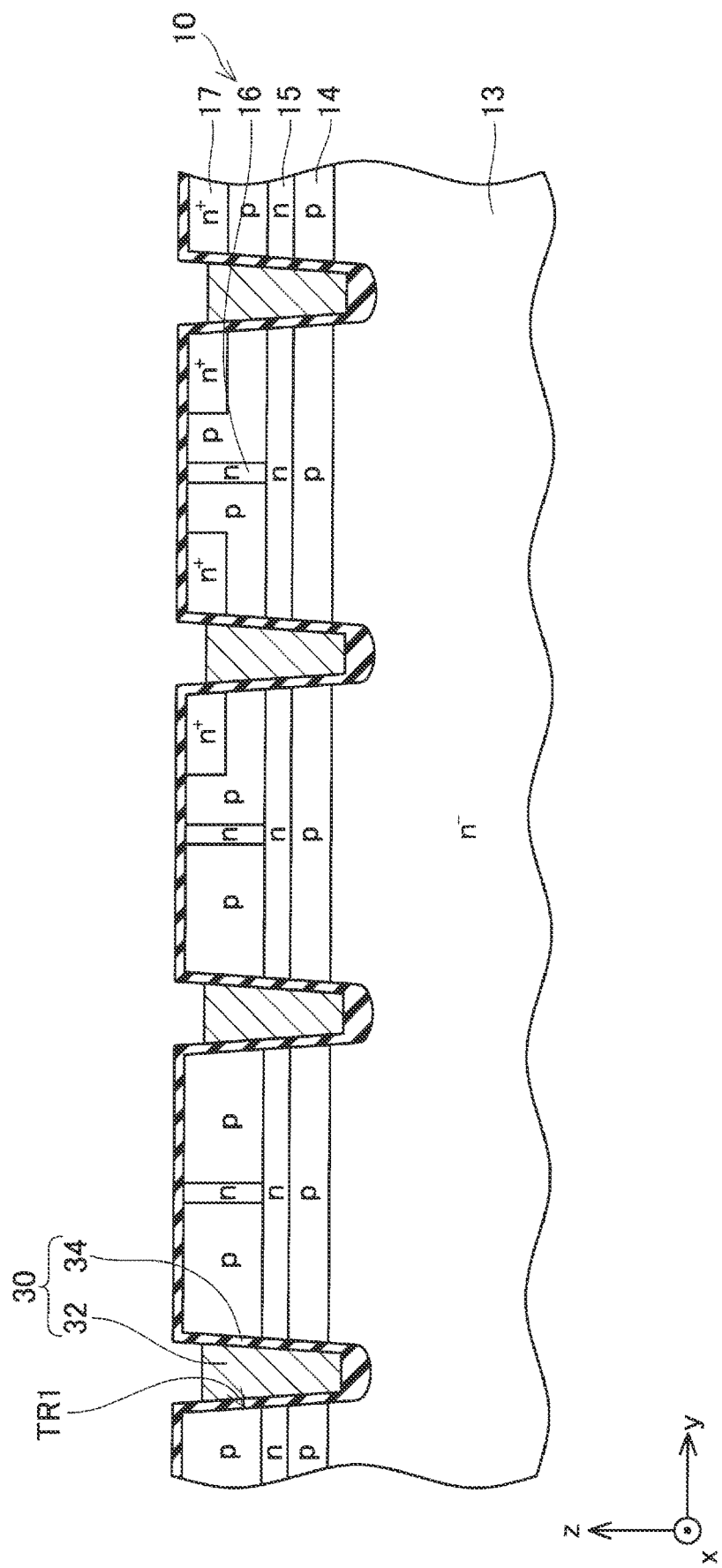
FIG. 6 schematically shows a cross-sectional view of a main part of the manufacturing process of the semiconductor device of the present embodiment, and is a partial cross-sectional view of the main part at a position corresponding to line II-II of FIG. 1.

Next, as shown in FIG. 6, the polysilicon gate electrode 32 is formed in the trench TR1 by utilizing the CVD technique, and the trench gate portion 30 is formed. The gate electrode 32 is formed so as to fill a part of the trench TR1. That is, the surface of the gate electrode 32 is arranged at a position deeper than the surface of the semiconductor substrate 10. This is because the gate electrode 32 is formed at a position spaced apart from the corner portion in order to suppress the leakage current at the corner portion formed by the surface of the semiconductor substrate 10 and the side surface of the trench TR1. As a result, a groove corresponding to the position of the gate electrode 32 is formed on the surface of the semiconductor substrate 10.

Figure 7:
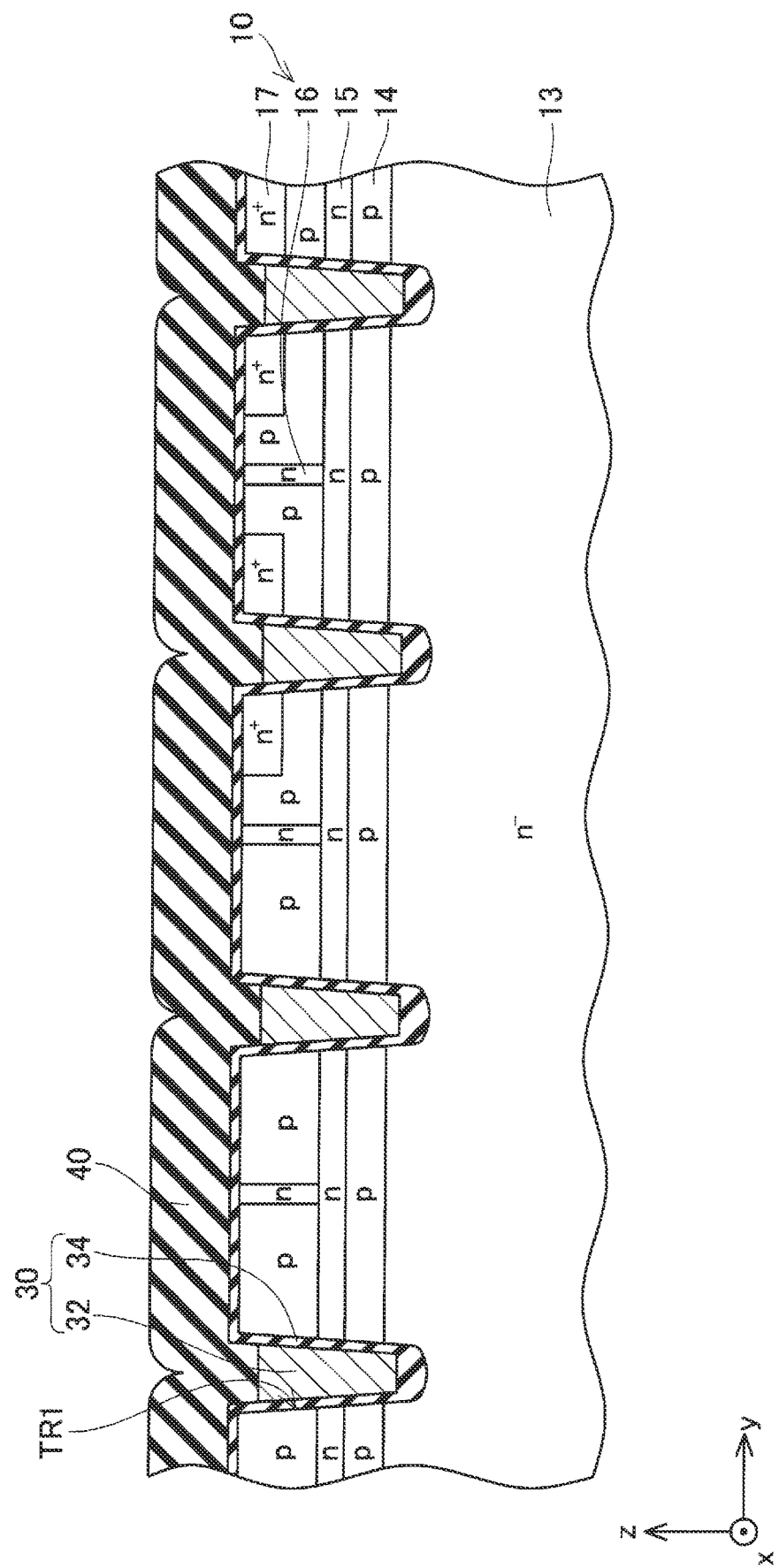
FIG. 7 schematically shows a cross-sectional view of a main part of the manufacturing process of the semiconductor device of the present embodiment, and is a partial cross-sectional view of the main part at a position corresponding to line II-II of FIG. 1.

Next, as shown in FIG. 7, the interlayer insulating film 40 is formed so as to cover the entire surface of the semiconductor substrate 10 by using the CVD technique. Silicon oxide including a large amount of boron, phosphorus, or the like is used as the interlayer insulating film 40. A groove corresponding to the position of the gate electrode 32 is formed on the surface of the interlayer insulating film 40.

Figure 8:
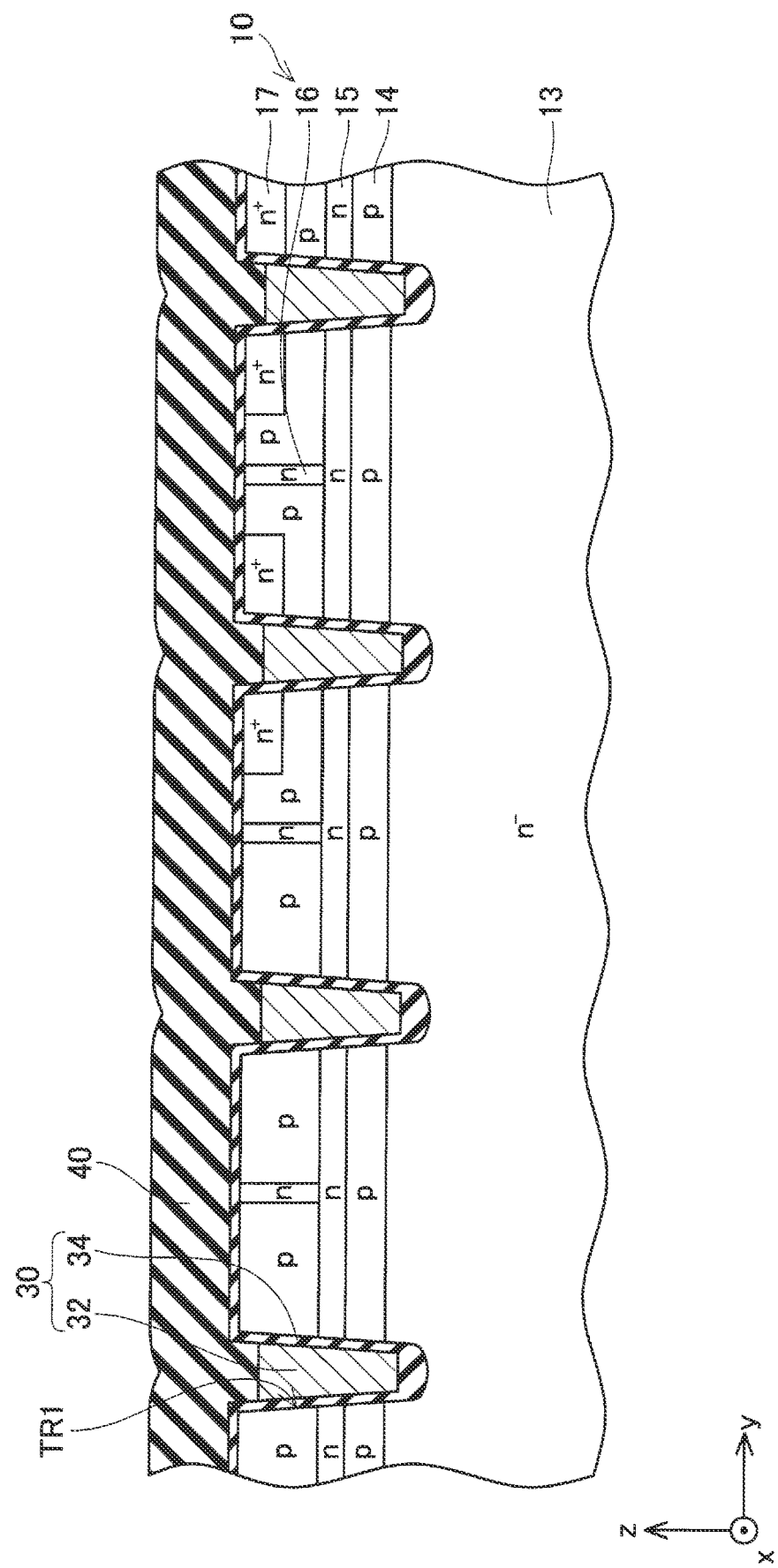
FIG. 8 schematically shows a cross-sectional view of a main part of the manufacturing process of the semiconductor device of the present embodiment, and is a partial cross-sectional view of the main part at a position corresponding to line II-II of FIG. 1.

Next, as shown in FIG. 8, the annealing treatment technique is used to melt the surface of the interlayer insulating film 40 and flatten the surface of the interlayer insulating film 40. The annealing temperature at this time is, for example, about 950° C.

Figure 9:
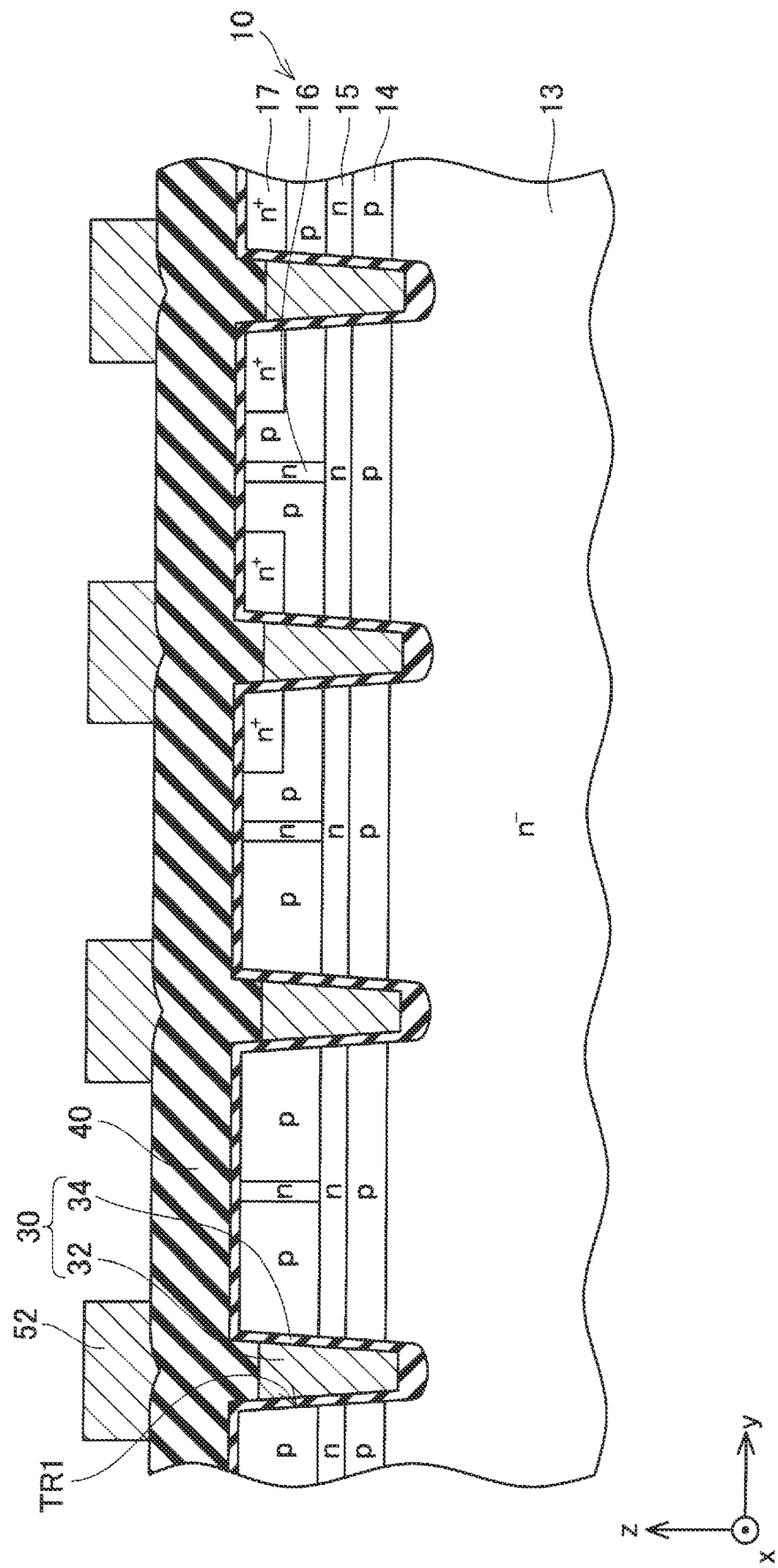
FIG. 9 schematically shows a cross-sectional view of a main part of the manufacturing process of the semiconductor device of the present embodiment, and is a partial cross-sectional view of the main part at a position corresponding to line II-II of FIG. 1.

Next, as shown in FIG. 9, the photoresist mask 52 is patterned on the surface of the interlayer insulating film 40 by using a photolithography technique and an etching technique. The mask 52 is selectively arranged according to the position where the trench gate portion 30 is formed.

Figure 10:
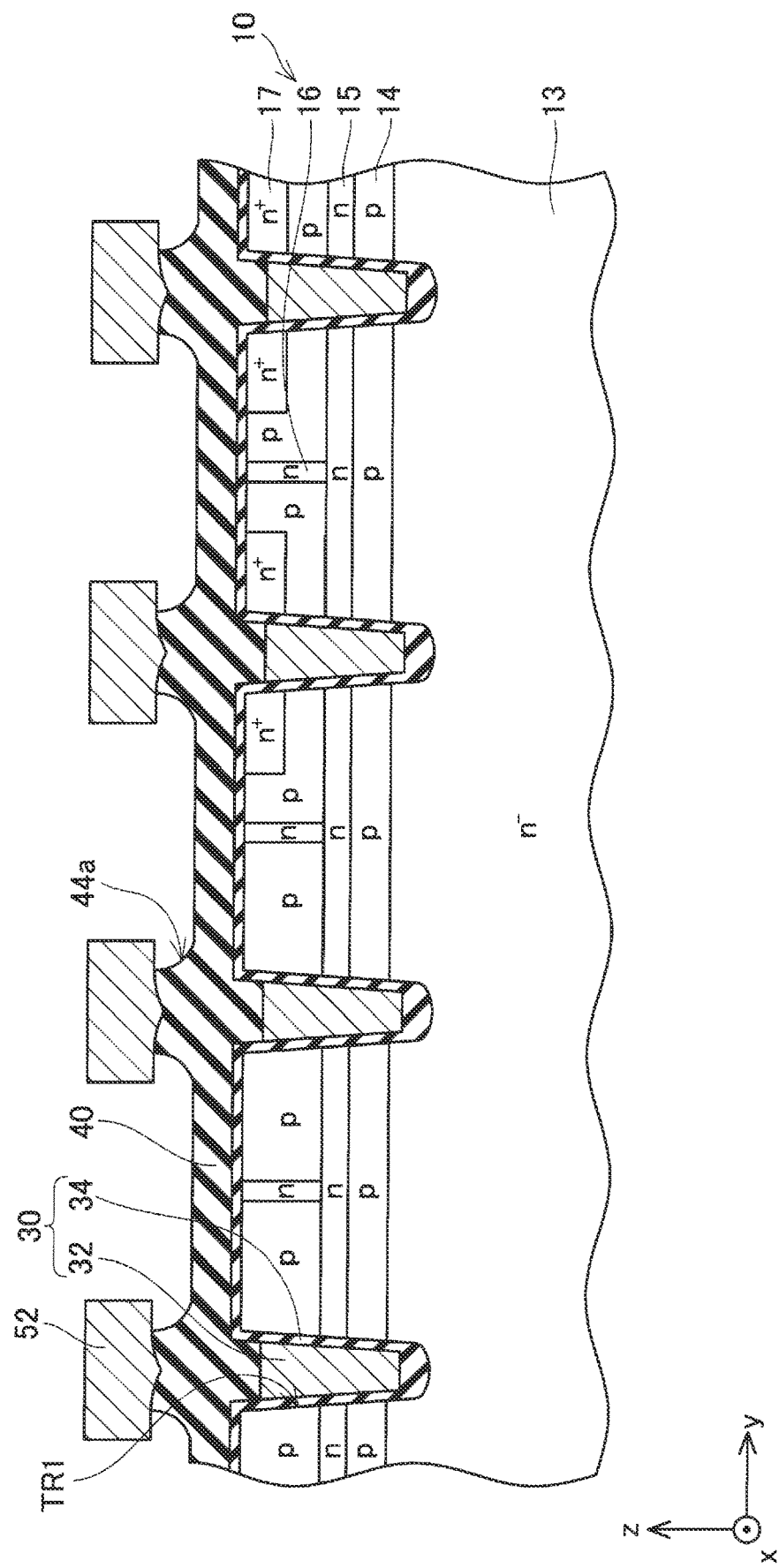
FIG. 10 schematically shows a cross-sectional view of a main part of the manufacturing process of the semiconductor device of the present embodiment, and is a partial cross-sectional view of the main part at a position corresponding to line II-II of FIG. 1.

Next, as shown in FIG. 10, a part of the interlayer insulating film 40 is etched by using an isotropic etching technique (for example, Chemical Dry Etching (CDE) technique). At this time, etching proceeds isotropically from the lateral direction with respect to the interlayer insulating film 40 existing below the mask 52, and the side surface of the interlayer insulating film 40 is processed into a concave curved surface. This portion serves as the upper side surface 44a (see FIG. 3) of the interlayer insulating film 40.

Figure 11:
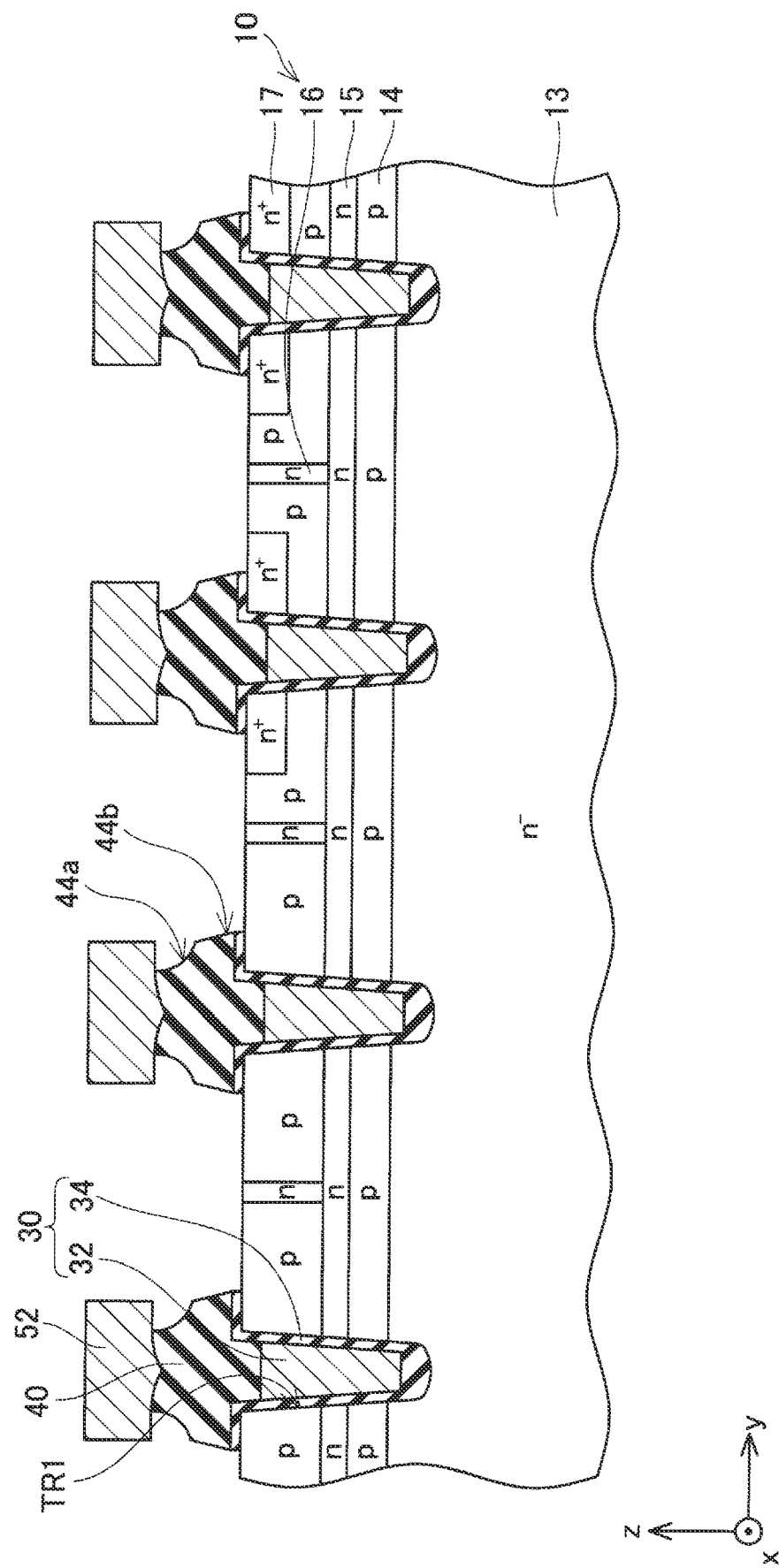
FIG. 11 schematically shows a cross-sectional view of a main part of the manufacturing process of the semiconductor device of the present embodiment, and is a partial cross-sectional view of the main part at a position corresponding to line II-II of FIG. 1.

Next, as shown in FIG. 11, a part of the interlayer insulating film 40 is etched by using an anisotropic etching technique (for example, Reactive Ion Etching (RIE) technique), and the surface of the semiconductor substrate 10 sandwiched between the masks 52 is exposed. At this time, the side surface of the interlayer insulating film 40 existing under the mask 52 is processed into a flat planar surface. This portion serves as the lower side surface 44b (see FIG. 3) of the interlayer insulating film 40.

Figure 12:
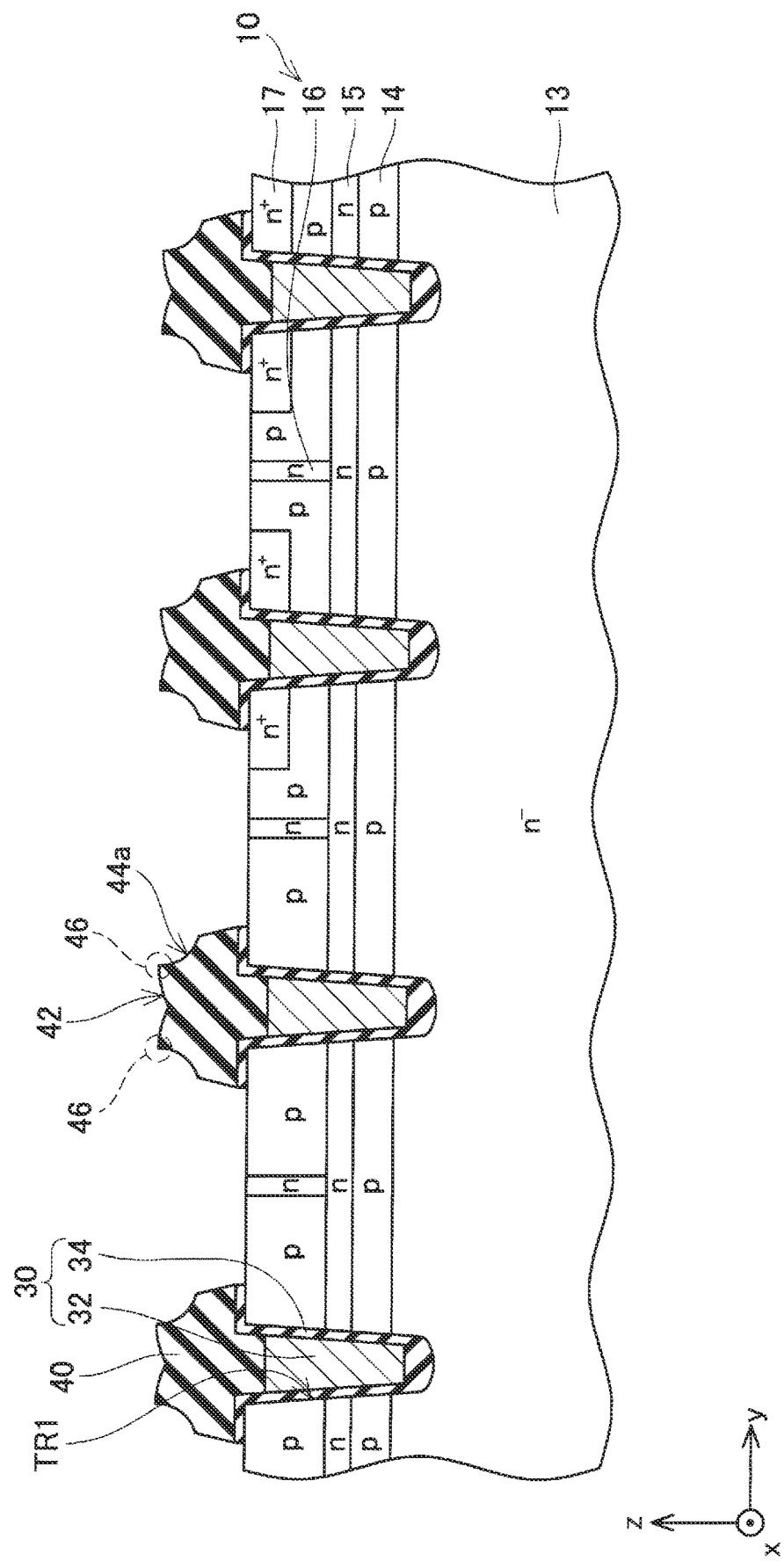
FIG. 12 schematically shows a cross-sectional view of a main part of the manufacturing process of the semiconductor device of the present embodiment, and is a partial cross-sectional view of the main part at a position corresponding to line II-II of FIG. 1.

Next, as shown in FIG. 12, the mask 52 is removed by using a wet etching technique. The interlayer insulating film 40 formed through these steps is configured such that the angle formed by the corner portion 46 between the top surface 42 and the upper side surface 44a is an acute angle.

Figure 13:
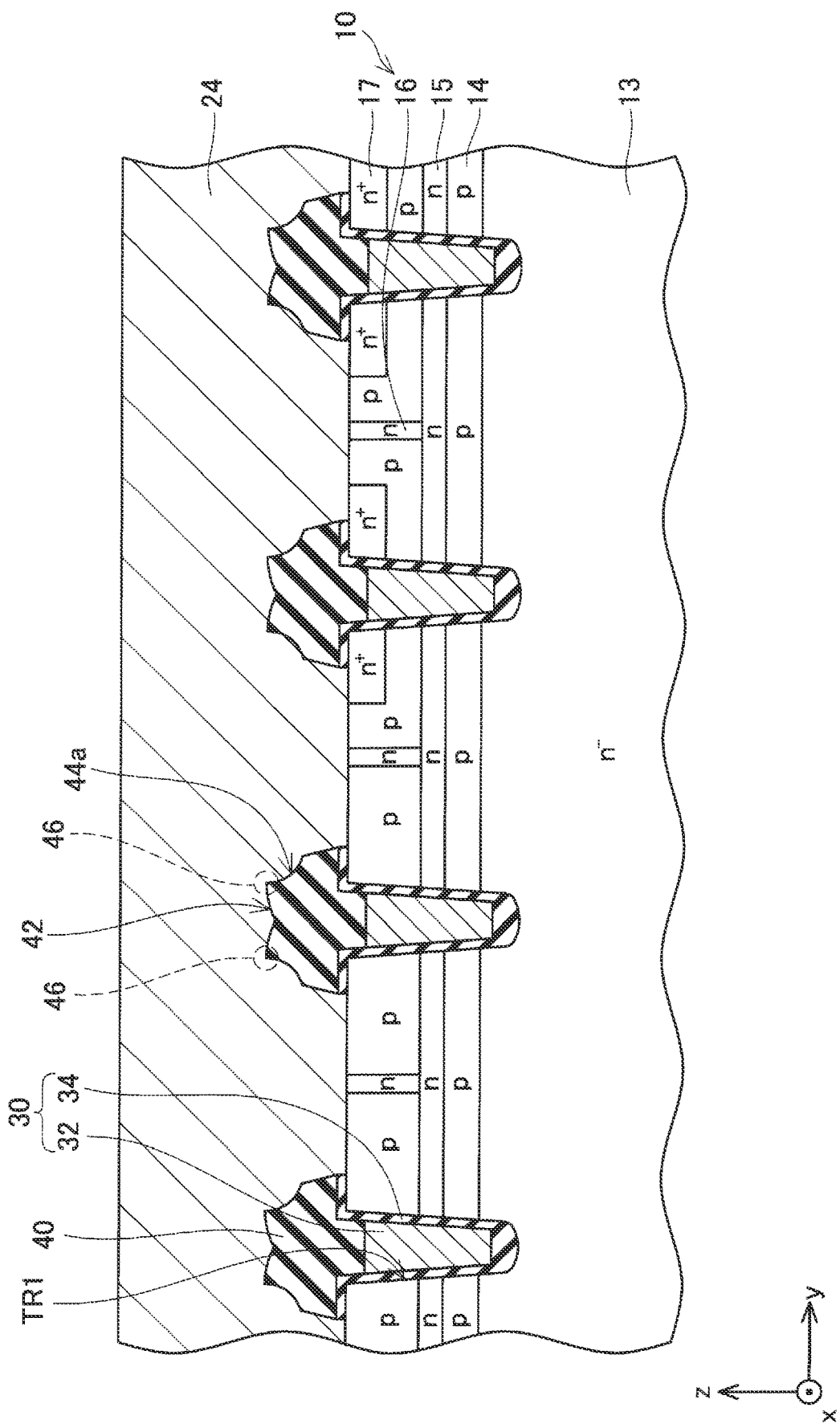
FIG. 13 schematically shows a cross-sectional view of a main part of the manufacturing process of the semiconductor device of the present embodiment, and is a partial cross-sectional view of the main part at a position corresponding to line II-II of FIG. 1.

Next, as shown in FIG. 13, an aluminum silicon emitter electrode 24 is formed so as to cover the surface of the semiconductor substrate 10 and the surface of the interlayer insulating film 40 by using a sputtering technique. The behavior of the silicon included in the emitter electrode 24 at this time will be described with reference to FIG. 14.

Figure 14:
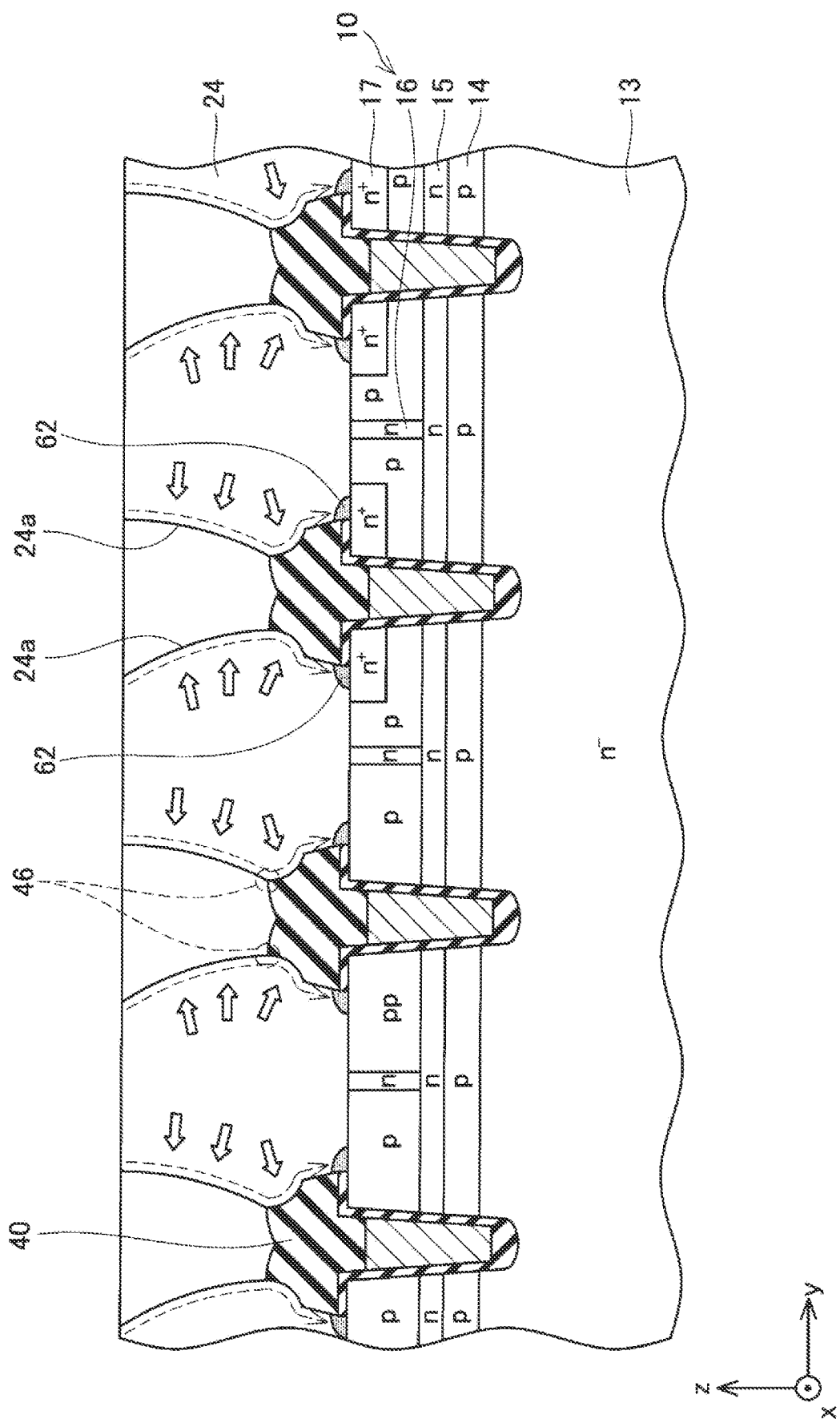
FIG. 14 schematically shows a cross-sectional view of a main part of the manufacturing process of the semiconductor device of the present embodiment, is a cross-sectional view of the main part at a position corresponding to the line II-II of FIG. 1, and is a drawing for explaining the behavior of silicon included in the emitter electrode.

As shown in FIG. 14, the deposited emitter electrode 24 has an aluminum grain boundary 24a. The aluminum grain boundary 24a is formed with extending upward from the corner 46 of the interlayer insulating film 40 as an original point in the process of depositing the emitter electrode 24. Specifically, since the corner portion 46 is configured to have an acute angle, the aluminum crystal deposited from the top surface of the interlayer insulating film 40 and the aluminum crystal deposited from the upper side surface 44a of the interlayer insulating film 40 are different from each other as aluminum crystals having different orientations, so that the aluminum grain boundary 24a is formed between them. When such an aluminum grain boundary 24a is present, the silicon included in the emitter electrode 24 that exceeds the solid solubility moves to the aluminum grain boundary 24a. The silicon that has moved to the aluminum grain boundary 24a diffuses along the aluminum grain boundary 24a. The silicon diffused along the aluminum grain boundary 24a reaches the surface of the semiconductor substrate 10 along the side surface of the interlayer insulating film 40, and becomes a silicon nodule 62 at that portion and stabilizes as the silicon nodule 62.

As described above, according to the above-mentioned manufacturing method, the position of the aluminum grain boundary 24a formed in the emitter electrode 24 can be controlled by processing the corner portion 46 of the interlayer insulating film 40 to an acute angle. The silicon nodule 62 can be selectively deposited at a position corresponding to the lower end of the side surface of the interlayer insulating film 40 on the surface of the semiconductor substrate 10. The position corresponding to the lower end of the side surface of the interlayer insulating film 40 is sufficiently separated from the formation position of the pillar region 16. Therefore, according to the above-mentioned manufacturing method, it is possible to prevent the silicon nodule 62 from being deposited at the formation position of the pillar region 16.

Next, the emitter electrode 24 is processed so as to remove the emitter electrode 24 on the peripheral region 10B (see FIG. 1) of the semiconductor substrate 10, and a protection film (for example, see a polyimide film) is deposited on the peripheral region 10B (see FIG. 1) of the semiconductor substrate 10. Finally, after the semiconductor substrate 10 is thinned, various semiconductor regions and collector electrodes 22 are formed on the back surface of the semiconductor substrate 10, and the semiconductor device 1 is completed.

As described above, according to the manufacturing method of the present embodiment, it is possible to prevent the silicon nodule 62 from forming at the formation position of the pillar region 16. The situation where the silicon nodule 62 is deposited at the formation position of the pillar region 16 and the barrier height between the pillar region 16 and the emitter electrode 24 is changed is suppressed. That is, in the semiconductor device 1, since the barrier height between the pillar region 16 and the emitter electrode 24 is stable, the difficulty of an increase in leakage current is suppressed. The semiconductor device 1 can have high reliability.

The technical elements disclosed herein are listed below. The following technical elements are useful independently.

The semiconductor device disclosed in the present specification includes a semiconductor substrate, a trench gate portion provided on one main surface of the semiconductor substrate, a surface electrode covering the upper part of the one main surface of the semiconductor substrate, and an interlayer insulating film that insulates the trench gate portion from the surface electrode. Examples of the type of this semiconductor device include a reverse conducting IGBT (Reverse Conducting Insulated Gate Bipolar Transistor) or a MOSFET (Metal Oxide Semiconductor Field Effect Transistor). Further, the trench gate portion may be a dummy gate. The semiconductor substrate has a first conductive type drift region, a second conductive type body region provided above the drift region, and a first conductive type barrier region provided below at least a part of the body region and a first conductive pillar region that extends from one of the main surfaces of the semiconductor substrate to the barrier region and makes Schottky contact with the surface electrode. The surface electrode is an alloy including silicon. As an example, the surface electrode may be made of aluminum silicon. The interlayer insulating film has an acute angle formed by the top surface and the side surface thereof.

A part of the side surface adjacent to the top surface may be formed of a concave curved surface. In this case, the angle formed by the top surface and the side surface of the interlayer insulating film becomes smaller.

The method for manufacturing a semiconductor device disclosed in the present specification is applicable to a method for manufacturing a semiconductor device which includes a semiconductor substrate, a trench gate portion provided on one main surface of the semiconductor substrate, a surface electrode covering an upper portion of the one main surface of the semiconductor substrate, and an interlayer insulating film that insulates the trench gate portion from the surface electrode. The semiconductor substrate includes a first conductive type drift region, a second conductive type body region disposed above the drift region, a first conductive type barrier region provided below at least a part of the body region, and a first conductive type pillar region that extends from the one main surface of the semiconductor substrate to the barrier region and makes a Schottky contact with the surface electrode. The surface electrode is an alloy including silicon. Examples of the type of this semiconductor device include a reverse conducting IGBT (Reverse Conducting Insulated Gate Bipolar Transistor) or a MOSFET (Metal Oxide Semiconductor Field Effect Transistor). Further, the trench gate portion may be a dummy gate. This manufacturing method includes: steps of: forming the interlayer insulating film on the one main surface of the semiconductor substrate on which the trench gate portion is formed; patterning a mask on a part of the interlayer insulating film corresponding to the position where the trench gate portion is formed; and etching a part of the interlayer insulating film using an isotropic etching technique, whereby the angle formed by the top surface and the side surface of the interlayer insulating film is controlled to be a sharp angle.

Although specific examples of the present disclosure have been described in detail above, these are merely examples and do not limit the scope of claims. The techniques described in the claims include various modifications and modifications of the specific examples illustrated above. In addition, the technical elements described in the present description or the drawings exhibit technical usefulness alone or in various combinations, and are not limited to the combinations described in the claims at the time of filing. In addition, the techniques illustrated in the present specification or drawings can achieve multiple purposes at the same time, and achieving one of the purposes itself has technical usefulness.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
   a semiconductor substrate;
   a trench gate portion arranged on one main surface of the semiconductor substrate;
   a surface electrode covering an upper side of the one main surface of the semiconductor substrate; and
   an interlayer insulating film insulating the trench gate portion from the surface electrode and arranged above the one main surface of the semiconductor substrate, wherein:
   the semiconductor substrate includes:
      a drift region having a first conductive type;
      a body region having a second conductive type and arranged above the drift region;
      a barrier region having the first conductive type and arranged below at least a part of the body region; and
      a pillar region having the first conductive type, extending from the one main surface of the semiconductor substrate to the barrier region, and in Schottky contact with the surface electrode;
   the surface electrode is made of an alloy including silicon;
   the interlayer insulating film has an acute angle between a top surface and a side surface thereof, the top surface and the side surface contacting the surface electrode; and
   the interlayer insulating film is formed with the acute angle between the top surface and the side surface such that the silicon in the surface electrode, which diffuses along a grain boundary in the surface electrode, is selectively deposited as a nodule on the one main surface of the semiconductor substrate at a position corresponding to a lower end of the side surface.

2. The semiconductor device according to claim 1, wherein:
   a part of the side surface adjacent to the top surface has a concave curved surface.

3. The semiconductor device according to claim 1, wherein:
   the surface electrode is made of aluminum silicon.

4. The semiconductor device according to claim 1, wherein:
   the side surface includes an upper side surface and a lower side surface;
   the upper side surface is formed adjacent to the top surface, and has a concave curved surface;
   the lower side surface is formed adjacent to the one main surface of the semiconductor substrate via a gate insulating film, and has a flat planar surface;
   the acute angle is between the top surface and the upper side surface; and
   the position corresponding to the lower end of the side surface is a lower end of the lower side surface.

5. The semiconductor device according to claim 1, wherein:
   the silicon in the surface electrode being selectively deposited as the nodule on the one main surface of the semiconductor substrate at the position corresponding to the lower end of the side surface includes the silicon being deposited over an emitter region, which is arranged in a surface layer of the semiconductor substrate and which is of the first conductive type.

6. A method for manufacturing a semiconductor device which includes:
   a semiconductor substrate;
   a trench gate portion arranged on one main surface of the semiconductor substrate;
   a surface electrode covering an upper side of the one main surface of the semiconductor substrate; and
   an interlayer insulating film insulating the trench gate portion from the surface electrode,
   wherein the semiconductor substrate includes a drift region having a first conductive type, a body region having a second conductive type and disposed above the drift region, a barrier region having the first conductive type and arranged below at least a part of the body region, and a pillar region having the first conductive type, extending from the one main surface of the semiconductor substrate to the barrier region, and in Schottky contact with the surface electrode, and
   wherein the surface electrode is made of an alloy including silicon, the method for manufacturing the semiconductor device comprising:
   depositing the interlayer insulating film on the one main surface of the semiconductor substrate on which the trench gate portion is formed;
   patterning a mask on the interlayer insulating film corresponding to a position where the trench gate portion is formed; and
   etching a part of the interlayer insulating film using an isotropic etching technique to form an angle between a top surface and a side surface of the interlayer insulating film to be an acute angle,
   wherein the interlayer insulating film is formed with the acute angle between the top surface and the side surface such that silicon in the surface electrode, which diffuses along a grain boundary in the surface electrode, is selectively deposited as a nodule on the one main surface of the semiconductor substrate at a position corresponding to a lower end of the side surface.

* * * * *